(12) United States Patent
Jiang et al.

(10) Patent No.: US 12,139,173 B2
(45) Date of Patent: Nov. 12, 2024

(54) DYNAMIC MODEL EVALUATION PACKAGE FOR AUTONOMOUS DRIVING VEHICLES

(71) Applicant: Baidu USA LLC, Sunnyvale, CA (US)

(72) Inventors: Shu Jiang, Sunnyvale, CA (US); Yu Cao, Sunnyvale, CA (US); Qi Luo, Sunnyvale, CA (US); Yu Wang, Sunnyvale, CA (US); Weiman Lin, Sunnyvale, CA (US); Longtao Lin, Sunnyvale, CA (US); Jinghao Miao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 970 days.

(21) Appl. No.: 17/152,601

(22) Filed: Jan. 19, 2021

(65) Prior Publication Data

US 2022/0227397 A1 Jul. 21, 2022

(51) Int. Cl.
*B60W 60/00* (2020.01)
*B60W 30/18* (2012.01)

(52) U.S. Cl.
CPC .. *B60W 60/0051* (2020.02); *B60W 30/18109* (2013.01); *B60W 60/001* (2020.02); *B60W 2420/408* (2024.01)

(58) Field of Classification Search
CPC ...... B60W 20/40; B60W 20/12; B60W 20/15; B60W 20/20; B60W 2510/244; B60W 2556/50; B60W 2710/244; B60W 10/08; B60W 10/30; B60W 20/11; B60W 20/13; B60W 10/06; B60W 2540/00;
(Continued)

(56) References Cited

U.S. PATENT DOCUMENTS 10,884,422 B2 * 1/2021 Zhang ................. G05D 1/0223
11,199,847 B2 * 12/2021 Zhu ..................... G05D 1/0223
(Continued)

FOREIGN PATENT DOCUMENTS

JP         2011511281 A     4/2011
JP         2017087816 A     5/2017
(Continued)

*Primary Examiner* — Masud Ahmed
(74) *Attorney, Agent, or Firm* — WOMBLE BOND DICKINSON (US) LLP

(57) ABSTRACT

Disclosed are performance metrics for evaluating the accuracy of a dynamic model in predicting the trajectory of ADV when simulating the behavior of the ADV under the control commands. The performance metrics may indicate the degree of similarity between the predicted trajectory of the dynamic model and the actual trajectory of the vehicle when applied with identical control commands. The performance metrics measure deviations of the predicted trajectory of the dynamic model from the actual trajectory based on the ground truths. The performance metrics may include cumulative or mean absolute trajectory error, end-pose difference (ED), two-sigma defect rate ($\varepsilon_{2\sigma}$), the Hausdirff Distance (HAU), the longest common sub-sequence error (LCSS), or dynamic time warping (DTW). The two-sigma defect rate represents the ratio of the number of points with true location error falling out of the $2\sigma$ range of the predicted location error over the total number of points in the trajectory.

20 Claims, 11 Drawing Sheets

(58) Field of Classification Search
CPC .. B60W 10/26; B60W 30/182; B60W 50/082; B60W 50/10; F02B 39/10; Y02T 10/62; Y04S 10/126; F02D 41/0007; G01C 21/3453

See application file for complete search history.

(56) References Cited

U.S. PATENT DOCUMENTS

| | | | |
|---|---|---|---|
| 11,885,712 B2* | 1/2024 | Sun | G01M 17/00 |
| 2019/0318267 A1* | 10/2019 | Zhang | G06N 20/00 |
| 2020/0269873 A1* | 8/2020 | Liu | B60W 50/0097 |
| 2020/0310451 A1* | 10/2020 | Zhu | B60W 10/04 |
| 2020/0324795 A1* | 10/2020 | Bojarski | G01C 21/3602 |
| 2021/0080353 A1* | 3/2021 | Sun | B60W 50/0205 |
| 2021/0200229 A1* | 7/2021 | Refaat | G06N 3/084 |
| 2022/0236063 A1* | 7/2022 | Mita | G01S 19/11 |
| 2022/0315046 A1* | 10/2022 | Jiang | B60W 60/00 |

FOREIGN PATENT DOCUMENTS

| | | |
|---|---|---|
| JP | 2019010967 A | 1/2019 |
| JP | 2019185783 A | 10/2019 |
| WO | 2019228626 A1 | 12/2019 |

* cited by examiner

400

| Application 401 | Planning and Control 402 | Perception 403 | Device Driver(s) 404 | Firmware 405 | Hardware 406 |

FIG. 4

DYNAMIC MODEL EVALUATION PACKAGE FOR AUTONOMOUS DRIVING VEHICLES

TECHNICAL FIELD

Embodiments of the present disclosure relate generally to operating autonomous vehicles. More particularly, embodiments of the disclosure relate to methods for evaluating the accuracy of simulation model used to emulate the behavior of autonomous driving vehicles (ADVs).

BACKGROUND

Vehicles operating in an autonomous mode (e.g., driverless) can relieve occupants, especially the driver, from some driving-related responsibilities. When operating in an autonomous mode, the vehicle can navigate to various locations using onboard sensors, allowing the vehicle to travel with minimal human interaction or in some cases without any passengers.

Motion planning and control are critical operations in autonomous driving. The safety, accuracy and efficiency of motion planning and control operations depend on the ability of the ADVs to sense and predict the motions of moving obstacles such as other vehicles or pedestrians as well as to recognize non-moving objects. Sensors such as cameras, light detection and range (LIDAR) units, radars, etc., are used to capture video and electromagnetic images of environments around the vehicles. The ADVs may process information captured by the sensors to perceive driving environment including obstacles, traffic elements and road features surrounding the ADVs for planning and controlling the motions of the ADVs.

To accelerate the development of planning and controlling systems, a control-in-the-loop simulator may be used to emulate the dynamic behavior of an ADV and its interaction with other vehicles, pedestrians, objects, and surrounding environment in high-fidelity driving scenarios. A dynamic model of the motions and trajectories of the ADV that accurately predicts the real-road results of the ADV may significantly reduce the time needed for on-board testing, development, and verification of the planning and control systems. As such, techniques to evaluate the accuracy of the dynamic model are needed.

BRIEF DESCRIPTION OF THE DRAWINGS

Embodiments of the disclosure are illustrated by way of example and not limitation in the figures of the accompanying drawings in which like references indicate similar elements.

FIG. 4 is a block diagram illustrating an architecture of an autonomous driving system according to one embodiment.

DETAILED DESCRIPTION

Figure 1:
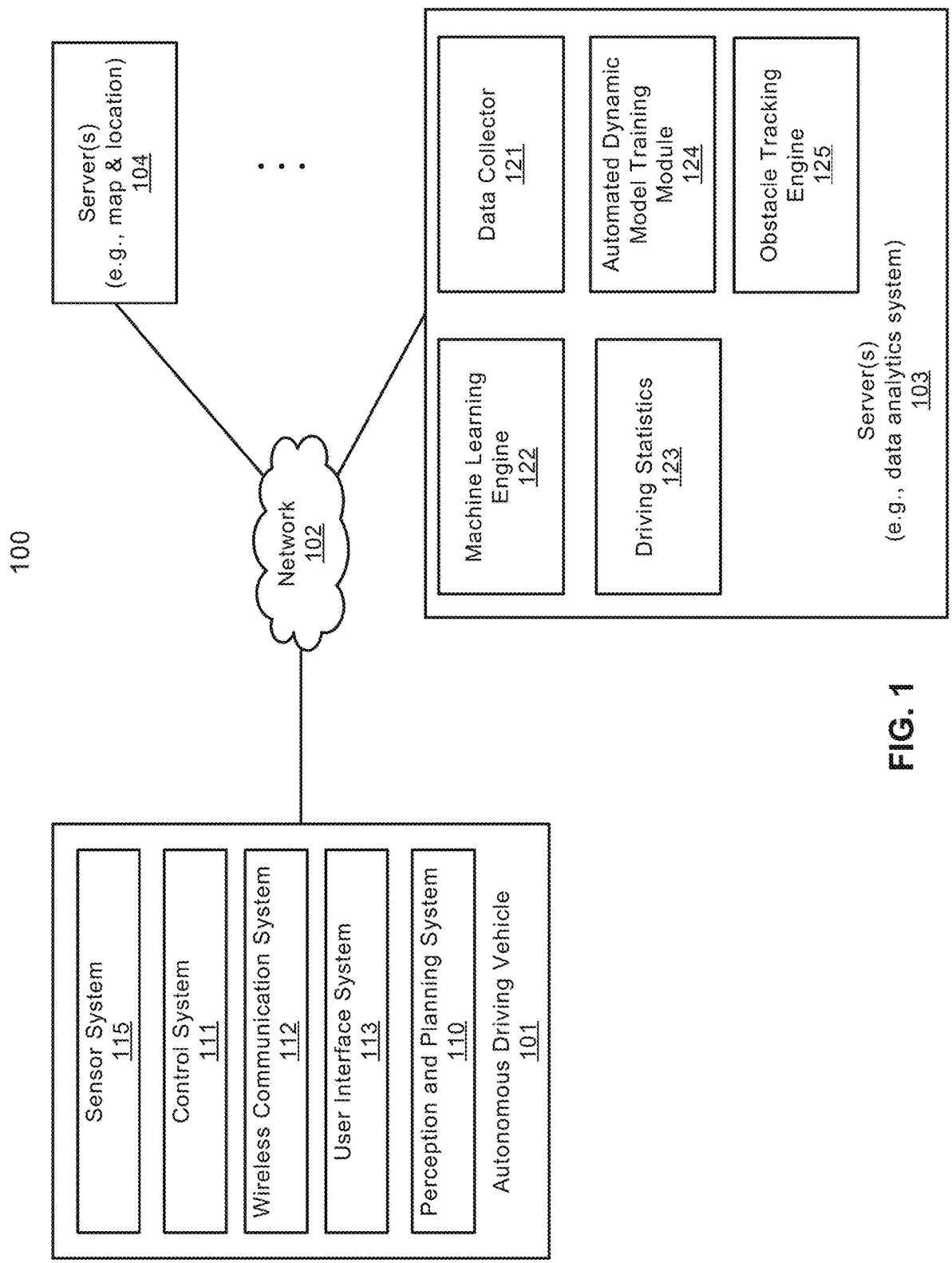
FIG. 1 is a block diagram illustrating a networked system according to one embodiment.

Various embodiments and aspects of the disclosures will be described with reference to details discussed below, and the accompanying drawings will illustrate the various embodiments. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosures.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

Motion planning and control of an ADV process information captured by sensors to perceive driving environment including objects, obstacles, traffic elements and road features surrounding the ADVs for planning and controlling the motions of the ADV. Control commands from the motion planning and control operations instruct actuators such as the throttle, steering, and brake of the ADV to operate in a prescribed motion to safely navigate the ADV through the driving environment. A control-in-the-loop simulator that uses a dynamic model to model the position, motion, or trajectory of the ADV based on the control commands may be used to develop, train, evaluate, and verify the planning and control operations in high-fidelity driving scenarios, reducing the need for real-world on-board testing. Assessment of the accuracy of the simulated or predicted output of the dynamic model with respect to the actual behavior of the ADV enables the performance of the dynamic model to be evaluated. The dynamic model may then be fine-tuned to more accurately predict the behavior of the ADV in the control-in-loop simulator.

Disclosed are performance metrics for evaluating the accuracy of the dynamic model in predicting the trajectory of ADV when simulating the behavior of the ADV under the command of the motion planning and control operations. The performance metrics may indicate the degree of similarity or conversely the degree of error between the predicted trajectory of the dynamic model and the actual trajectory of the vehicle when applied with identical control commands from the motion planning and control operations. The actual trajectory of the vehicle may be ground truths measured by sensors of the vehicle recorded during on-board testing under real-world driving scenarios. Input to the dynamic model may be the state of the vehicle and control commands of the vehicle that are also recorded during the on-board testing. In one embodiment, a state of the vehicle includes the speed, acceleration and angular velocity of the vehicle at a particular point in time. A control command may be a throttle command, a brake command, or a steering command. The performance metrics may be generated under common driving maneuvers and scenarios, including long distance urban driving scenarios.

In one embodiment, the performance metrics may include metrics that evaluate deviations of the predicted trajectory of the dynamic model from the actual trajectory based on the ground truths. The performance metrics may include cumulative absolute trajectory error or mean absolute trajectory error, end-pose difference (ED), two-sigma defect rate, the Hausdirff Distance (HAU), the longest common sub-sequence error (LCSS), and dynamic time warping (DTW).

In one embodiment, a method for evaluating the performance of a dynamic model used to simulate the behavior of an ADV is disclosed. The method includes receiving by the dynamic model a set of states of the ADV for a number of time points and a set of control commands to be applied to the ADV for the corresponding time points. The method also includes generating by the dynamic model a set of predicted positions of a simulated trajectory for the ADV based on the set of states and the set of control commands. The method further receiving a set of actual positions of a ground truth trajectory for the ADV. The actual positions are generated by applying the control commands to the ADV at the corresponding time points. The method further generating evaluating metrics to measure the degree of similarity between the set of predicted positions of the simulated trajectory and the set of actual positions of the ground truth trajectory at the corresponding time points.

FIG. 1 is a block diagram illustrating an autonomous vehicle network configuration according to one embodiment of the disclosure. Referring to FIG. 1, network configuration 100 includes autonomous vehicle 101 that may be communicatively coupled to one or more servers 103-104 over a network 102. Although there is one autonomous vehicle shown, multiple autonomous vehicles can be coupled to each other and/or coupled to servers 103-104 over network 102. Network 102 may be any type of networks such as a local area network (LAN), a wide area network (WAN) such as the Internet, a cellular network, a satellite network, or a combination thereof, wired or wireless. Server(s) 103-104 may be any kind of servers or a cluster of servers, such as Web or cloud servers, application servers, backend servers, or a combination thereof. Servers 103-104 may be data analytics servers, content servers, traffic information servers, map and point of interest (MPOI) servers, or location servers, etc.

An autonomous vehicle refers to a vehicle that can be configured to operate in an autonomous mode in which the vehicle navigates through an environment with little or no input from a driver. Such an autonomous vehicle can include a sensor system having one or more sensors that are configured to detect information about the environment in which the vehicle operates. The vehicle and its associated controller(s) use the detected information to navigate through the environment. Autonomous vehicle 101 can operate in a manual mode, a full autonomous mode, or a partial autonomous mode.

In one embodiment, autonomous vehicle 101 includes, but is not limited to, perception and planning system 110, vehicle control system 111, wireless communication system 112, user interface system 113, and sensor system 115. Autonomous vehicle 101 may further include certain common components included in ordinary vehicles, such as, an engine, wheels, steering wheel, transmission, etc., which may be controlled by vehicle control system 111 and/or perception and planning system 110 using a variety of communication signals and/or commands, such as, for example, acceleration signals or commands, deceleration signals or commands, steering signals or commands, braking signals or commands, etc.

Components 110-115 may be communicatively coupled to each other via an interconnect, a bus, a network, or a combination thereof. For example, components 110-115 may be communicatively coupled to each other via a controller area network (CAN) bus. A CAN bus is a vehicle bus standard designed to allow microcontrollers and devices to communicate with each other in applications without a host computer. It is a message-based protocol, designed originally for multiplex electrical wiring within automobiles, but is also used in many other contexts.

Figure 2:
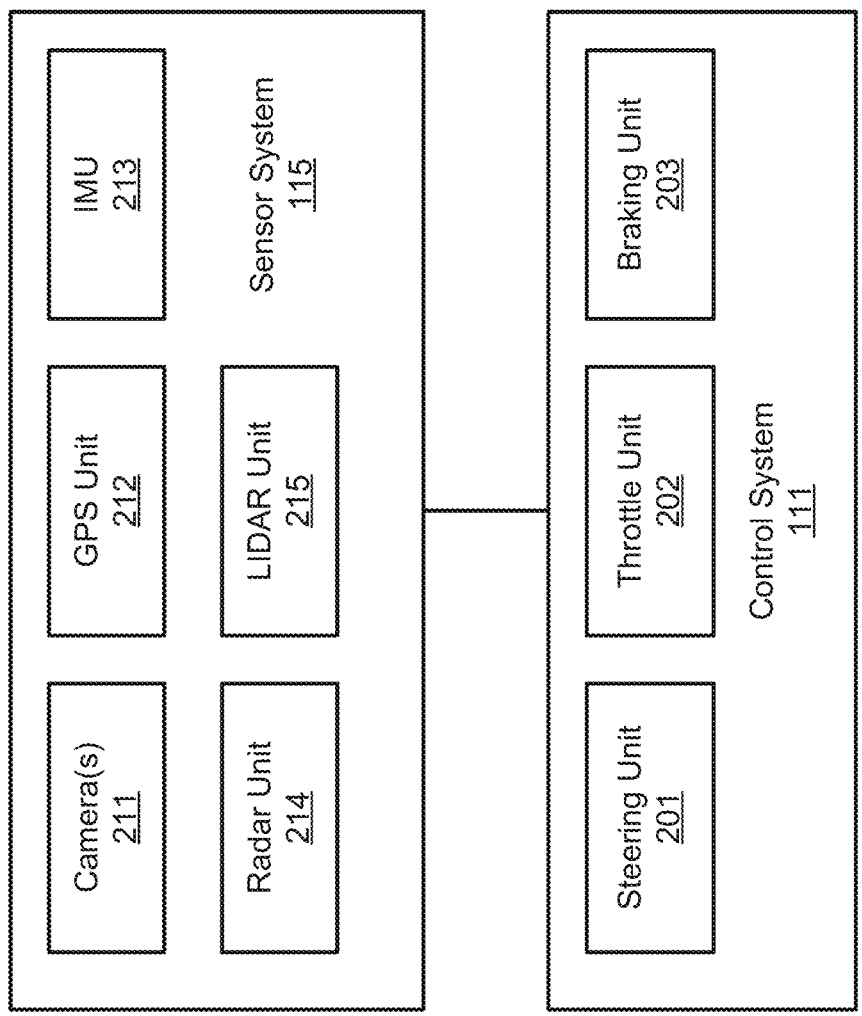
FIG. 2 is a block diagram illustrating an example of a sensor system and control system used with an autonomous vehicle according to one embodiment.

Referring now to FIG. 2, in one embodiment, sensor system 115 includes, but it is not limited to, one or more cameras 211, global positioning system (GPS) unit 212, inertial measurement unit (IMU) 213, radar unit 214, and a light detection and range (LIDAR) unit 215. GPS system 212 may include a transceiver operable to provide information regarding the position of the autonomous vehicle. IMU unit 213 may sense position and orientation changes of the autonomous vehicle based on inertial acceleration. Radar unit 214 may represent a system that utilizes radio signals to sense objects within the local environment of the autonomous vehicle. In some embodiments, in addition to sensing objects, radar unit 214 may additionally sense the speed and/or heading of the objects. LIDAR unit 215 may sense objects in the environment in which the autonomous vehicle is located using lasers. LIDAR unit 215 could include one or more laser sources, a laser scanner, and one or more detectors, among other system components. Cameras 211 may include one or more devices to capture images of the environment surrounding the autonomous vehicle. Cameras 211 may be still cameras and/or video cameras. A camera may be mechanically movable, for example, by mounting the camera on a rotating and/or tilting a platform.

The sensor system 115 may further include other sensors, such as a sonar sensor, an infrared sensor, a steering sensor, a throttle sensor, a braking sensor, and an audio sensor (e.g., microphone). An audio sensor may be configured to capture sound from the environment surrounding the autonomous vehicle. A steering sensor may be configured to sense the steering angle of a steering wheel, wheels of the vehicle, or a combination thereof. A throttle sensor and a braking sensor sense the throttle position and braking position of the vehicle, respectively. In some situations, a throttle sensor and a braking sensor may be integrated as an integrated throttle/braking sensor.

In one embodiment, vehicle control system 111 includes, but is not limited to, steering unit 201, throttle unit 202 (also referred to as an acceleration unit), and braking unit 203. Steering unit 201 is to adjust the direction or heading of the vehicle. Throttle unit 202 is to control the speed of the motor or engine that in turn control the speed and acceleration of the vehicle. Braking unit 203 is to decelerate the vehicle by providing friction to slow the wheels or tires of the vehicle. Note that the components as shown in FIG. 2 may be implemented in hardware, software, or a combination thereof.

Referring back to FIG. 1, wireless communication system 112 is configured to allow communication between autonomous vehicle 101 and external systems, such as devices, sensors, other vehicles, etc. For example, wireless communication system 112 can wirelessly communicate with one or more devices directly or via a communication network, such as servers 103-104 over network 102. Wireless communication system 112 can use any cellular communication network or a wireless local area network (WLAN), e.g., using WiFi to communicate with another component or system. Wireless communication system 112 could communicate directly with a device (e.g., a mobile device of a passenger, a display device, a speaker within vehicle 101), for example, using an infrared link, Bluetooth, etc. User interface system 113 may be part of peripheral devices implemented within vehicle 101 including, for example, a keyboard, a touch screen display, a microphone, and a speaker, etc.

Some or all of the functions of autonomous vehicle 101 may be controlled or managed by perception and planning system 110, especially when operating in an autonomous driving mode. Perception and planning system 110 includes the necessary hardware (e.g., processor(s), memory, storage) and software (e.g., operating system, planning and routing programs) to receive information from sensor system 115, control system 111, wireless communication system 112, and/or user interface system 113, process the received information, plan a route or path from a starting point to a destination point, and then drive vehicle 101 based on the planning and control information. Alternatively, perception and planning system 110 may be integrated with vehicle control system 111.

For example, a user as a passenger may specify a starting location and a destination of a trip, for example, via a user interface. Perception and planning system 110 obtains the trip related data. For example, perception and planning system 110 may obtain location and route information from an MPOI server, which may be a part of servers 103-104. The location server provides location services and the MPOI server provides map services and the POIs of certain locations. Alternatively, such location and MPOI information may be cached locally in a persistent storage device of perception and planning system 110. In one embodiment, the location and MPOI information may be obtained from HD maps downloaded from servers 103-104.

While autonomous vehicle 101 is moving along the route, perception and planning system 110 may also obtain real-time traffic information from a traffic information system or server (TIS). Note that servers 103-104 may be operated by a third party entity, such as a service provider that downloads a starting position and a destination position to perception and planning system 110 for perception and planning system 110 to plan a route. The third party may also issue commands to perception and planning system 110 to command autonomous vehicle 101 to start traveling on the planned route. Alternatively, the functionalities of servers 103-104 may be integrated with perception and planning system 110. Based on the real-time traffic information, MPOI information, and location information, as well as real-time local environment data detected or sensed by sensor system 115 (e.g., obstacles, objects, nearby vehicles), perception and planning system 110 can plan an optimal route and drive vehicle 101, for example, via control system 111, according to the planned route to reach the specified destination safely and efficiently.

Server 103 may be a data analytics system to perform data analytics services for a variety of clients. In one embodiment, data analytics system 103 includes data collector 121 and machine learning engine 122. Data collector 121 collects driving statistics 123 from a variety of vehicles, either autonomous vehicles or regular vehicles driven by human drivers. Driving statistics 123 include information indicating the driving commands (e.g., throttle, brake, steering commands) issued and responses of the vehicles (e.g., speeds, accelerations, decelerations, directions, angular velocity) captured by sensors of the vehicles at different points in time. In one aspect, the driving commands and states of vehicle 101 captured in a driving scenario may be used as input to a dynamic model to simulate the behavior of drive vehicle 101 in a control-in-the-loop simulation. The output from the dynamic model representing the simulated positions of vehicle 101 may be compared with the actual position or ground truth values captured by the sensor system 115 to generate metrics to evaluate the performance of the dynamic model as will be discussed. Driving statistics 123 may further include information describing the driving environments at different points in time, such as, for example, routes (including starting and destination locations), MPOIs, road conditions, weather conditions, etc. Driving statistics 123 may further include poses captured by IMU and GPS sensors describing a position and orientation of the vehicles.

Based on driving statistics 123, machine learning engine 122 generates or trains a set of rules, algorithms, and/or predictive models 124 for a variety of purposes. For example, the machine learning engine 122 can train a dynamic model. An automated dynamic model training model can be provided in the server 103 to control the extraction of training data from the driving statistics 123 and the training of the dynamic model using the extracted driving statistics. In one embodiment, algorithms 124 may include deep learning neural network models used to predict the trajectories of other vehicles in the environment of autonomous vehicle 101 to enable perception and planning system 110 to navigate autonomous vehicle 101 to avoid colliding with the other vehicles.

Algorithms 124 may be uploaded on ADVs to be utilized during autonomous driving in real-time or may be utilized by other modules such as obstacle tracking engine 125 of server 103. In one embodiment, obstacle tracking engine 125 can predict the near-term motions or trajectories of moving obstacles such as vehicles or pedestrians surrounding autonomous vehicle 101 based on the past trajectories of the moving obstacles and the environment in which the moving obstacles operate. Although obstacle tracking engine 125 is shown as part of server 103, in some embodiments, engine 125 may be part of server 104.

Figure 3A:
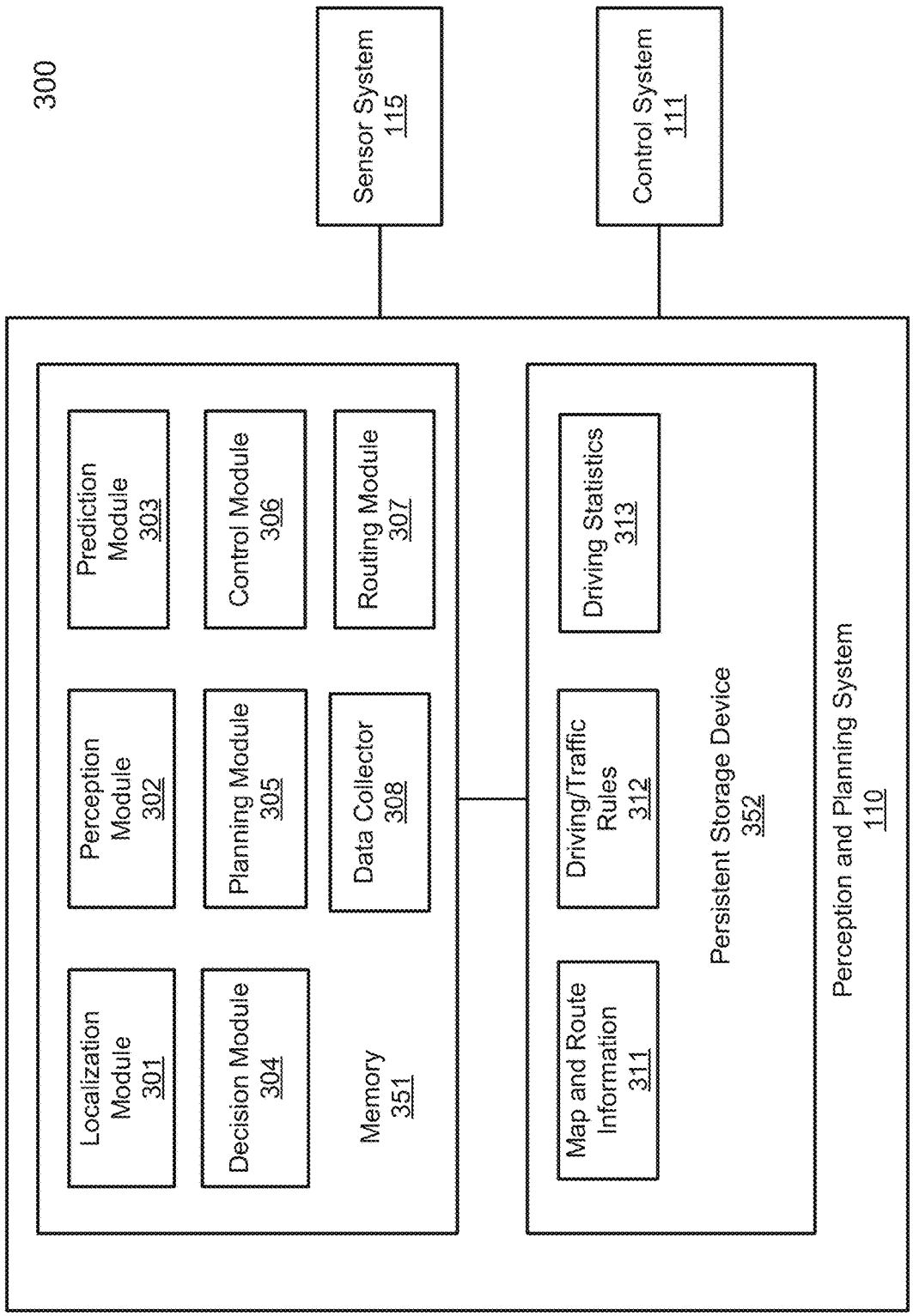
FIGS. 3A-3B are block diagrams illustrating an example of a perception and planning system used with an autonomous vehicle according to one embodiment.
Figure 3B:
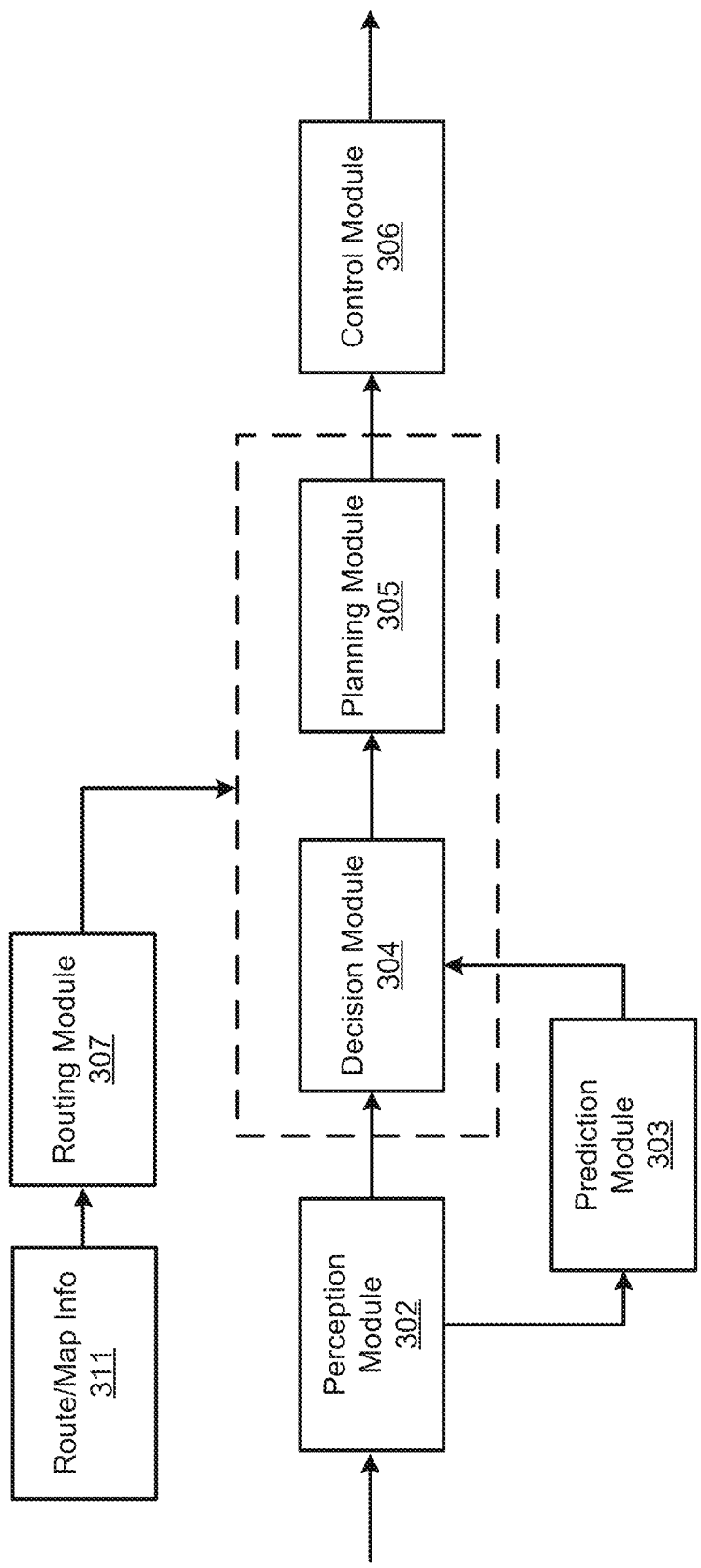

FIGS. 3A and 3B are block diagrams illustrating an example of a perception and planning system used with an autonomous vehicle according to one embodiment. System 300 may be implemented as a part of autonomous vehicle 101 of FIG. 1 including, but is not limited to, perception and planning system 110, control system 111, and sensor system 115. Referring to FIGS. 3A-3B, perception and planning system 110 includes, but is not limited to, localization module 301, perception module 302, prediction module 303, decision module 304, planning module 305, control module 306, routing module 307, and data collector 308.

Some or all of modules 301-308 may be implemented in software, hardware, or a combination thereof. For example, these modules may be installed in persistent storage device 352, loaded into memory 351, and executed by one or more processors (not shown). Alternatively, such components can be implemented as executable code programmed or embedded into dedicated hardware such as an integrated circuit (e.g., an application specific IC or ASIC), a digital signal processor (DSP), or a field programmable gate array (FPGA), which can be accessed via a corresponding driver and/or operating system from an application. Furthermore, such components can be implemented as specific hardware logic in a processor or processor core as part of an instruction set accessible by a software component via one or more specific instructions. Note that some or all of these modules may be communicatively coupled to or integrated with some or all modules of vehicle control system 111 of FIG. 2. Some of modules 301-308 may be integrated together as an integrated module. For example, decision module 304 and planning module 305 may be integrated as a single module.

Localization module 301 determines a current location of autonomous vehicle 300 (e.g., leveraging GPS unit 212) and manages any data related to a trip or route of a user. Localization module 301 (also referred to as a map and route module) manages any data related to a trip or route of a user. A user may log in and specify a starting location and a destination of a trip, for example, via a user interface. Localization module 301 communicates with other components of autonomous vehicle 300, such as map and route information 311, to obtain the trip related data. For example, localization module 301 may obtain location and route information from a location server and a map and POI (MPOI) server. A location server provides location services and an MPOI server provides map services and the POIs of certain locations, which may be cached as part of map and route information 311. In one embodiment, the map and route information 311 may be HD maps. The HD maps may be downloaded from the location server and the MPOI server. While autonomous vehicle 300 is moving along the route, localization module 301 may also obtain real-time traffic information from a traffic information system or server.

Based on the sensor data provided by sensor system 115 and localization information obtained by localization module 301, a perception of the surrounding environment is determined by perception module 302. The perception information may represent what an ordinary driver would perceive surrounding a vehicle in which the driver is driving. The perception can include the lane configuration, traffic light signals, a relative position of another vehicle, a pedestrian, a building, crosswalk, or other traffic related signs (e.g., stop signs, yield signs), etc., for example, in a form of an object. The lane configuration includes information describing a lane or lanes, such as, for example, a shape of the lane (e.g., straight or curvature), a width of the lane, how many lanes in a road, one-way or two-way lane, merging or splitting lanes, exiting lane, etc.

Perception module 302 may include a computer vision system or functionalities of a computer vision system to process and analyze images captured by one or more cameras in order to identify objects and/or features in the environment of autonomous vehicle 101. The objects can include traffic signals, road way boundaries, other vehicles, pedestrians, and/or obstacles, etc. The computer vision system may use an object recognition algorithm, video tracking, and other computer vision techniques. In some embodiments, the computer vision system can map an environment, track objects, and estimate the speed of objects, etc. Perception module 302 can also detect objects based on other sensors data provided by other sensors such as a radar and/or LIDAR. In one embodiment, perception module 302 may generate an image map that shows the current positions, current headings, and past trajectories of other vehicles or pedestrians in the environment of autonomous vehicle 101.

For each of the objects, prediction module 303 predicts what the object will behave under the circumstances. The prediction is performed based on the perception data perceiving the driving environment at the point in time in view of a set of map/rout information 311 and traffic rules 312. For example, if the object is a vehicle at an opposing direction and the current driving environment includes an intersection, prediction module 303 will predict whether the vehicle will likely move straight forward or make a turn. If the perception data indicates that the intersection has no traffic light, prediction module 303 may predict that the vehicle may have to fully stop prior to enter the intersection. If the perception data indicates that the vehicle is currently at a left-turn only lane or a right-turn only lane, prediction module 303 may predict that the vehicle will more likely make a left turn or right turn respectively.

For each of the objects, decision module 304 makes a decision regarding how to handle the object. For example, for a particular object (e.g., another vehicle in a crossing route) as well as its metadata describing the object (e.g., a speed, direction, turning angle), decision module 304 decides how to encounter the object (e.g., overtake, yield, stop, pass). Decision module 304 may make such decisions according to a set of rules such as traffic rules or driving rules 312, which may be stored in persistent storage device 352.

Routing module 307 is configured to provide one or more routes or paths from a starting point to a destination point. For a given trip from a start location to a destination location, for example, received from a user, routing module 307 obtains route and map information 311 and determines all possible routes or paths from the starting location to reach the destination location. Routing module 307 may generate a reference line in a form of a topographic map for each of the routes it determines from the starting location to reach the destination location. A reference line refers to an ideal route or path without any interference from others such as other vehicles, obstacles, or traffic condition. That is, if there is no other vehicle, pedestrians, or obstacles on the road, an ADV should exactly or closely follows the reference line. The topographic maps are then provided to decision module 304 and/or planning module 305. Decision module 304 and/or planning module 305 examine all of the possible routes to select and modify one of the most optimal routes in view of other data provided by other modules such as traffic conditions from localization module 301, driving environment perceived by perception module 302, and traffic condition predicted by prediction module 303. The actual path or route for controlling the ADV may be close to or different from the reference line provided by routing module 307 dependent upon the specific driving environment at the point in time.

Thus, based on a decision for each of the objects perceived, decision module 304 and/or planning module 305 plans a path or route for the autonomous vehicle, as well as driving parameters (e.g., distance, speed, and/or turning angle), using the reference line provided by routing module 307 as a basis. That is, for a given object, decision module 304 decides what to do with the object, while planning module 305 determines how to do it. For example, for a given object, decision module 304 may decide to pass the object, while planning module 305 may determine whether to pass on the left side or right side of the object. Planning and control data is generated by planning module 305 including information describing how vehicle 300 would move in a next moving cycle (e.g., next route/path segment). For example, the planning and control data may instruct vehicle 300 to move 10 meters at a speed of 30 miles per hour (mph), then change to a right lane at the speed of 25 mph.

Based on the planning and control data, control module 306 controls and drives the autonomous vehicle, by sending proper commands or signals to vehicle control system 111, according to a route or path defined by the planning and control data. The planning and control data include sufficient information to drive the vehicle from a first point to a second point of a route or path using appropriate vehicle settings or driving parameters (e.g., throttle, braking, steering commands) at different points in time along the path or route.

In one embodiment, the planning phase is performed in a number of planning cycles, also referred to as driving cycles, such as, for example, in every time interval of 100 milliseconds (ms). For each of the planning cycles or driving cycles, one or more control commands will be issued based on the planning and control data. That is, for every 100 ms, planning module 305 plans a next route segment or path segment, for example, including a target position and the time required for the ADV to reach the target position. Alternatively, planning module 305 may further specify the specific speed, direction, and/or steering angle, etc. In one embodiment, planning module 305 plans a route segment or path segment for the next predetermined period of time such as 5 seconds. For each planning cycle, planning module 305 plans a target position for the current cycle (e.g., next 5 seconds) based on a target position planned in a previous cycle. Control module 306 then generates one or more control commands (e.g., throttle, brake, steering control commands) based on the planning and control data of the current cycle.

Note that decision module 304 and planning module 305 may be integrated as an integrated module. Decision module 304/planning module 305 may include a navigation system or functionalities of a navigation system to determine a driving path for the autonomous vehicle. For example, the navigation system may determine a series of speeds and directional headings to affect movement of the autonomous vehicle along a path that substantially avoids perceived obstacles while generally advancing the autonomous vehicle along a roadway-based path leading to an ultimate destination. The destination may be set according to user inputs via user interface system 113. The navigation system may update the driving path dynamically while the autonomous vehicle is in operation. The navigation system can incorporate data from a GPS system and one or more maps so as to determine the driving path for the autonomous vehicle.

Decision module 304/planning module 305 may further include a collision avoidance system or functionalities of a collision avoidance system to identify, evaluate, and avoid or otherwise negotiate potential obstacles in the environment of the autonomous vehicle. For example, the collision avoidance system may effect changes in the navigation of the autonomous vehicle by operating one or more subsystems in control system 111 to undertake swerving maneuvers, turning maneuvers, braking maneuvers, etc. The collision avoidance system may automatically determine feasible obstacle avoidance maneuvers on the basis of surrounding traffic patterns, road conditions, etc. For example, the collision avoidance system may be configured such that a swerving maneuver is not undertaken when other sensor systems detect pedestrians, vehicles, construction barriers, etc. in the region adjacent the autonomous vehicle that would be swerved into. The collision avoidance system may automatically select the maneuver that is both available and maximizes safety of occupants of the autonomous vehicle. In one example, the collision avoidance system may select an avoidance maneuver predicted to cause the least amount of acceleration in a passenger cabin of the autonomous vehicle.

According to one embodiment, data collector 308 is configured to collect driving statistics data and store the same in persistent storage device 352 as a part of driving statistics 313. Driving statistics 313 can then be utilized for evaluating the performance of a dynamic model as will be described.

FIG. 4 is a block diagram illustrating system an architecture for an autonomous driving according to one embodiment. System architecture 400 may represent system architecture of an autonomous driving system as shown in FIGS. 3A and 3B. Referring to FIG. 4, system architecture 400 includes, but it is not limited to, application layer 401, planning and control (PNC) layer 402, perception layer 403, driver layer 404, firmware layer 405, and hardware layer 406. Application layer 401 may include user interface or configuration application that interacts with users or passengers of an autonomous driving vehicle, such as, for example, functionalities associated with user interface system 113. PNC layer 402 may include functionalities of at least planning module 305 and control module 306. Perception layer 403 may include functionalities of at least perception module 302. In one embodiment, there is an additional layer including the functionalities of prediction module 303 and/or decision module 304. Alternatively, such functionalities may be included in PNC layer 402 and/or perception layer 403. Firmware layer 405 may represent at least the functionality of sensor system 115, which may be implemented in a form of a field programmable gate array (FPGA). Hardware layer 406 may represent the hardware of the autonomous driving vehicle such as control system 111. Layers 401-403 can communicate with firmware layer 405 and hardware layer 406 via device driver layer 404.

Figure 5:
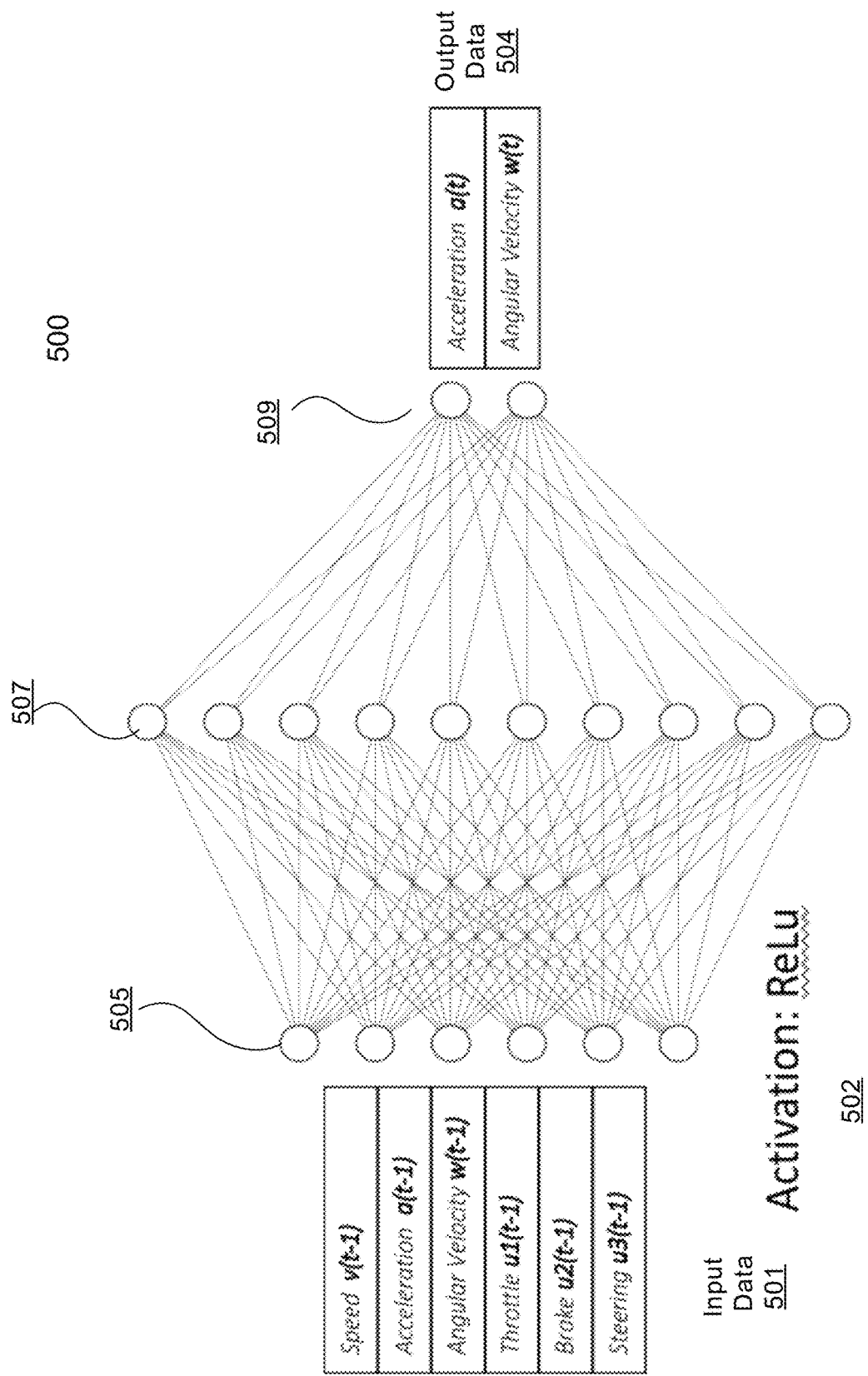
FIG. 5 illustrates an example dynamic model in accordance with an embodiment.

FIG. 5 illustrates an example dynamic model 500 for simulating the dynamic behavior of a vehicle in accordance with an embodiment. In this example, the dynamic model 500 can be a multilayer perceptron (MLP) neural network model trained using real-world data collected by sensors in vehicles. The dynamic model 500 includes a collection of connected neurons designed to model a human brain. Neurons in the dynamic model can be fully connected, with each node in one layer connecting with a certain weight to every node in the following layer. During the training of the dynamic model, the dynamic model changes connection weights after each piece of data is processed based on the amount of error in the output compared to the expected result.

In one embodiment, the dynamic model 500 can include an input layer 505 to receive input data 501, an output layer 509 that makes decisions or predictions or classification about the input data 501, and an arbitrary number of hidden layers (for example, hidden layer 507) between the input layer 501 and the output layer 509. The hidden layers are the computational engine of the dynamic model 500. Neurons in the hidden layer 507 can include activation functions for transforming the input data 501. Rectified Linear Unit (ReLU) 502 indicates an example activation function used in the dynamic model 500. For example, ReLU 502 may return 0 if it receives any negative input; and for any positive value returns, it may return that value back. Although dynamic model 500 shows one hidden layer 507 and one output layer 509, the dynamic model 500 can include multiple hidden layers and multiple output layers.

In an embodiment, the input data 501 for the neural network model 500 includes states of an ADV (e.g., a speed, an acceleration, and an angular velocity), and control commands (e.g., a throttle command, a brake command, and a steering command) received from the command module 306 for a first driving cycle. The input data 501 can be processed by one or more hidden layers and transformed to the output data 504, which are the expected or simulated states of the ADV for a second driving cycle. In one aspect, the output data 504 may include the expected or simulated acceleration and angular velocity of the ADV. Based on the expected acceleration and angular velocity, the expected speed of the ADV for the second driving cycle can be computed. The output data 504 for the second driving cycle may be fed back to the dynamic model 500 and used with the control commands for the second driving cycle to predict the output for the next driving cycle. In one aspect, the output data 504 over many driving cycles may be used to generate the positions or ground truth values of the ADV along a trajectory of a driving scenario. While the dynamic model 500 is shown as a MLP neural network model, dynamic model 500 may also be implemented as a classical rule-based model as long as it has the same input data 501 and output data 504 as the MLP neural network model.

Figure 6:
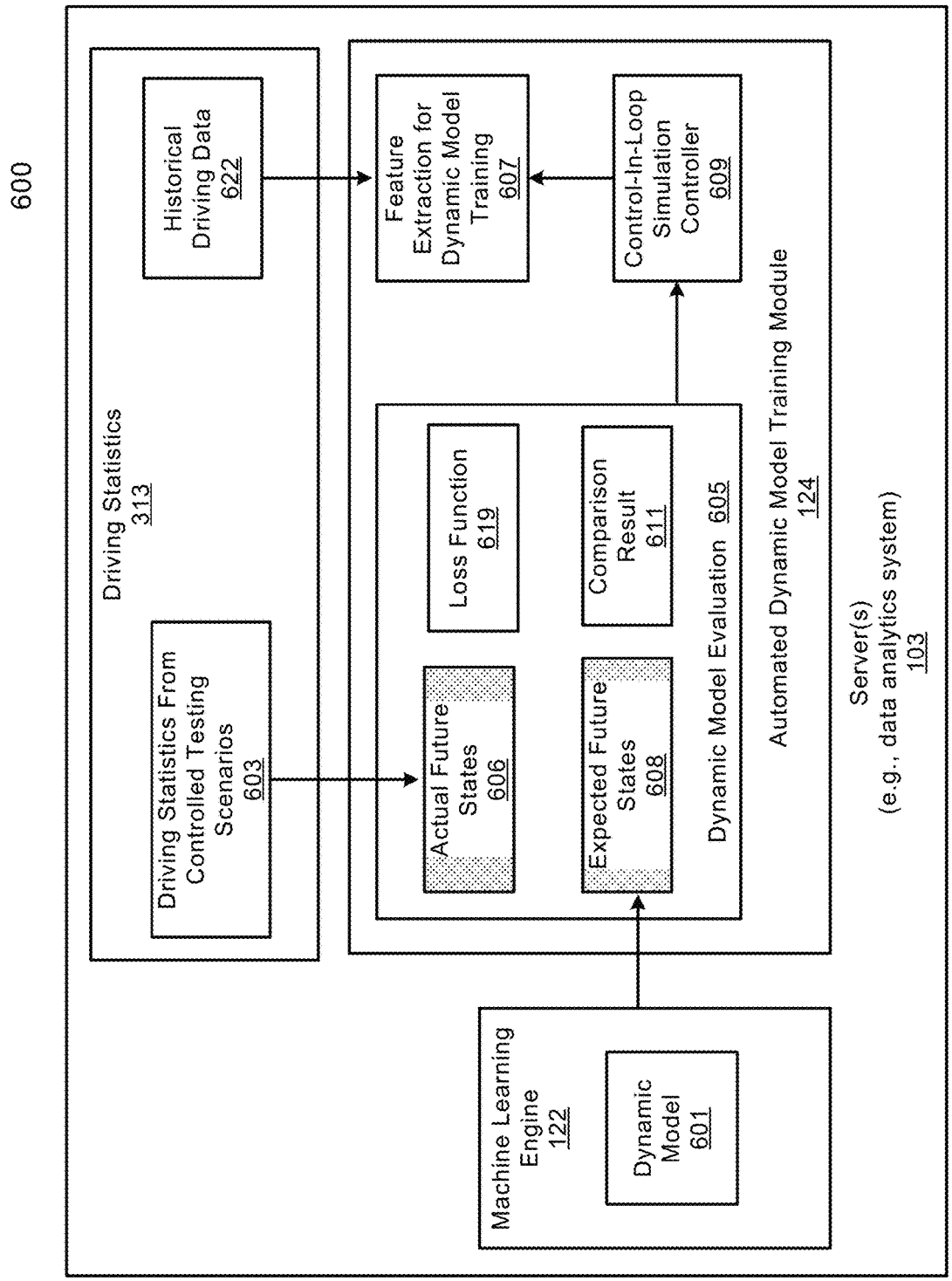
FIG. 6 illustrates an example system 600 for training a dynamic model shown in FIG. 5 in accordance with an embodiment.

FIG. 6 illustrates an example system 600 for training a dynamic model shown in FIG. 5 in accordance with an embodiment. As shown in FIG. 6, the example dynamic training system 600 includes the automated dynamic training module 124 and the driving statistics module 313 for training the dynamic model 601. The automated dynamic training module 124 includes a dynamic model evaluation module 605, a feature extraction module 607, and a training controller 609. The driving statics module 313 includes historical driving statistics 622 and driving statistics 603 for controlled testing scenarios.

The historical driving statistics 622 includes real-world data collected by sensors (e.g., IMU 213 and GPS 212 of sensory system 115) to record real-time dynamics (e.g., states) of vehicles in various scenarios that may cover a variety of road types, obstacle types and road environments. For example, the real-world data can be downloaded from the Apollo Open Data Platform of BAIDU™. The driving statistics 603 for controlled testing scenarios are real-world data generated by vehicles driven by human drivers.

In one embodiment, the training controller 609 can implement an algorithm to automate a process of extracting training data, training the dynamic model 601 using the training data, and evaluating the dynamic model 601 iteratively until the dynamic model 601 meets the specified requirements.

In one embodiment, the training controller 609 can automatically generate a predetermined equally-spaced value ranges for each feature of a number of features. A feature and a driving parameter can be used interchangeably in this disclosure. For example, for the driving parameter of speed, the training controller 609 can generate the following value ranges: 0-5 mps, 5-10 mps, 10-15 mps, 15-20 mps, and 20-25 mps. From each of the equally-spaced value range, the training controller 309 can extract a value from historical driving statics 622. In one embodiment, the historical driving statistics 622 can be a subset of the Apollo Open Data Platform of BAIDU™, and can be stored in a data storage that is in synchronization with the Apollo Open Data Platform. Therefore, there can be sufficient data points from each range of values.

Once the value ranges for each driving parameter are determined, the training controller 609 can extract data from each range for that driving parameter from historical driving statistics 622 to create a number of feature scenarios, each of which represents a value for a driving parameter, or a combination of values for multiple driving parameters (also referred to features or driving features in this disclosure).

As an illustrative example, the training controller 609 can create feature scenarios for, e.g., three driving parameters: steering angle, speed, and accelerator. For each driving parameter, the training controller 609 can create a number of equally-spaced ranges. For example, the simulator controller 609 can create 12 equally-space ranges for steering angle, 5 equally-space ranges for speed, and 7 equally-space ranges for accelerator. In one implementation, a total of 420 of feature scenarios (i.e., 12*5*7=420) would be created using a value from each of the above-mentioned ranges. Different numbers of feature scenarios can be created in other implementations.

In one embodiment, the training controller 609 can invoke the feature extraction module 607 to extract the data from historical driving statistics 622 for creating the feature scenarios. With the training data for each feature scenario, the training controller 609 can invoke services, functions, routines, libraries, and/or application programming interfaces (APIs) provided by the machine learning engine 122 to train a dynamic model 601. The training controller 609 subsequently can evaluate the dynamic model 601 by performing inferences using data from the driving statistics 603. In one embodiment, the training controller 609 can invoke the dynamic module evaluation module 605 to evaluate the dynamic model 601 based on performance metrics.

As shown in FIG. 6, the dynamic model 601 can receive, from the driving statistics 603, data that are generated from a number of controlled testing scenarios. Unlike testing data that are generated by vehicles operated in a natural way, the data generated from the controlled testing scenarios can be data generated by a vehicle under a variety of driving scenarios or driving conditions, which are specifically created for the purpose of generating testing data for those driving conditions or driving scenarios.

In one embodiment, the testing data can include ground truth values for a number of carefully designed controlled testing scenarios to test the performance of the training dynamic model 601. A controlled testing scenario is a feature scenario. One or more controlled testing scenarios are designed for each feature.

For example, one controlled testing scenarios would be to turn the steering 180 degrees to the left, another controlling testing scenario would be to turn the steering wheel 180 degree to the right, and yet another controlled testing scenario would be to drive from point A to point B in one minute. For each of the controlled testing scenarios, a ground truth value is recorded in the driving statistics 603, which may be compared against the output of the dynamic model 601 for each of the controlled testing scenarios.

In one embodiment, the driving statistics 603 can include captured states of a vehicle and one or more control commands for a number of driving cycles of the controlled testing scenarios. Examples of the states include a speed, an acceleration, and an angular velocity of the ADV for a current driving cycle; examples of the control commands include a throttle command, a brake command and a steering command for a current driving cycle. Each state of a current driving cycle can have a corresponding expected future state 608 and an actual future state 606 for a next driving cycle. The corresponding expected future state can be the output of the dynamic model 601, while the actual future state 606 can be the ground truth value from the real-world data generated under the controlled testing scenarios.

In an embodiment, the dynamic model evaluation module 605 can compare each actual future state 606 and each expected future state 608 using a loss function 610 to generate a comparison result 611. In one aspect, the comparison result 611 may be evaluation metrics that indicate the accuracy of the dynamic model 601 in predicting the actual trajectory of the vehicle in the controlled testing scenarios. The dynamic model evaluation module 605 can grade the inference performance of the dynamic model 601 for each feature scenario based on the comparison result 611 and/or the loss function 610.

In one embodiment, each feature scenario can include values for multiple features or a value for one feature. For example, a feature scenario can be a speed of 5 miles per second; a speed of 5 miles per second, a steering angle of 5 degrees to the left; or a speed of 5 miles per second, a steering angle of 5 degrees to the left, and a throttle rate of 15%. Thus, each feature scenario can be associated with one or more features. For all feature scenarios associated with a particular feature, a root mean squared error or other performance metrics can be computed based on the comparison result between the ground truth value and an expected value from the dynamic model 601. A performance score can be calculated using a predetermined algorithm for each root mean squared error for each feature.

Based on the performance scores, the number of features associated with the controlled testing scenarios can be ranked. The training controller 609 can identify one or more features that receive a score lower than a predetermined threshold, and extract additional data using the feature extraction module 607 from the historical driving data 622 for the one or more features to retrain the dynamic model 601. After the retraining using the additional data, the dynamic model evaluation module 605 can be invoked again to evaluate the performance of the dynamic model 601 for the one or more features. The process can be automatically repeated until the dynamic model 601 has met the predetermined requirements for each of the features that are used to train the dynamic model 601 and for which the controlled testing scenarios have been designed. In one embodiment, the process for evaluating the performance metrics or performance scores may be implemented to assess the accuracy of the dynamic model 601 after the dynamic model 601 has been trained.

In one embodiment, the above process of identifying one or more features that receive the lower score than the predetermined threshold can be used to identify one or more features scenarios that receive a score lower than the predetermined threshold. Similarly, the feature extraction module 607 can extract additional data from the for the one or more feature scenarios to retrain the dynamic model 601. After the retraining using the additional data, the dynamic model evaluation module 605 can be invoked again to evaluate the performance of the dynamic model 601 for the one or more feature scenarios. The process can be automatically repeated until the dynamic model 601 has met the predetermined requirements for each of the feature scenarios that have been previously created.

Figure 7:
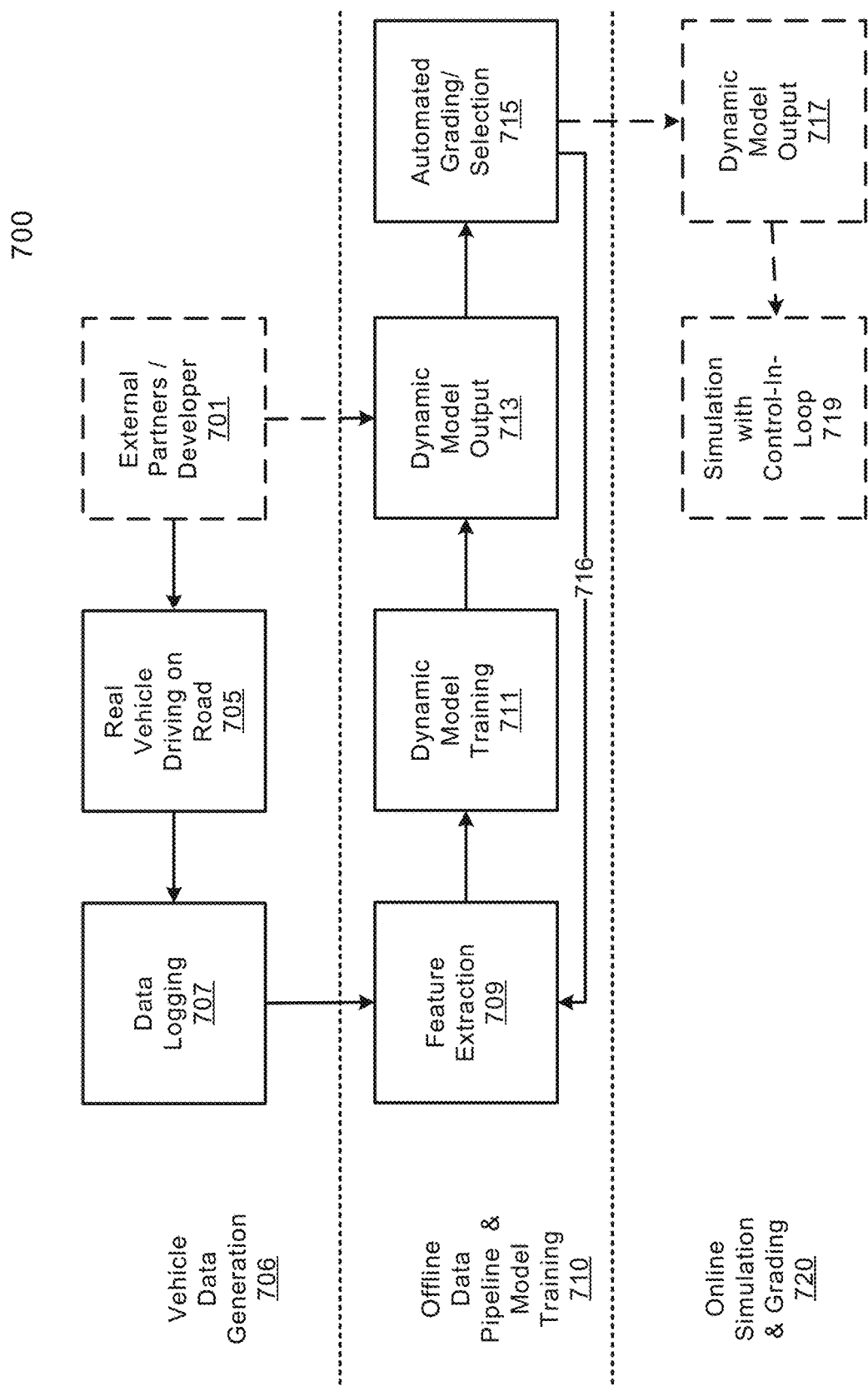
FIG. 7 illustrates an example flow diagram of training a dynamic model in accordance with an embodiment.

FIG. 7 illustrates an example flow diagram 700 of training a dynamic model in accordance with an embodiment. As shown in FIG. 7, an automatic loop of training a dynamic model can include a vehicle data generation 706 phase and an offline data and pipeline & model training phase 710. Once the dynamic model is fully trained and can meet the predefined requirements, the dynamic model can be put into a control-in-the-loop simulation in an online simulation & grading phase 720.

More specifically, during the vehicle data generation phase 706, external partners or dynamic model developers 701 can collect real-world driving statistics by manually driving vehicles on roads 705, and log the driving statistics in a machine learning training datasets storage 707, such as the Apollo Open Data Platform of BAIDU™.

During the offline data pipeline and model training phase 710, data for predefined feature scenarios 709 associated with a set of pre-defined features are extracted to be used for training a number of dynamic models in operation 711. Once the dynamic models are trained, the dynamic models can be evaluated offline using historical driving statistics. Based on the outputs 713 of the dynamic models and the ground truths, dynamic models can be graded and a dynamic model with the highest score can be selected in operation 715. In one aspect, performance of the dynamic models may be evaluated based on the degree of similarity between the trajectories generated by the dynamic models and the ground truths.

In one embodiment, the selected dynamic model can be evaluated again against driving statistics from a number of controlled testing scenarios by extracting driving parameters or features from logged data in operation 716 so that the dynamic model can be further refined. The controlled testing scenarios can represent a variety of combinations of values from driving parameter of ADV for which the dynamic model may be trained.

Examples of the driving parameters can include braking, accelerating, idle speeding, reverse driving, driving straight, left turn or right turn, U-turn, lane changing, and parking driving. Each driving parameter can have multiple values. A value from one parameter or a combination of values from multiple parameters may constitute a controlled testing scenario.

Inferences can be performed by the dynamic model using driving statistics from the controlled testing scenarios. Outputs of the dynamic model can be compared with the ground truths for each controlled testing scenario. The performance of the dynamic model on each controlled testing scenario can be graded using performance metrics, and those controlled testing scenarios that receive a score below a predetermined threshold will be identified.

Further, based on the performance metrics of the controlled testing scenarios, driving parameters or features used to train the dynamic model can also be ranked, and one or more features for which the dynamic model fails to reach a predetermined performance threshold can be identified. The first steps for ranking the features includes determining all the controlled feature scenarios for a feature; comparing the ground truth values for each controlled feature scenario and the expected value generated by the dynamic model in response to receiving that controlled feature scenario as an input; calculating the performance metrics such as the root mean squared errors or transformed values thereof (e.g., performance scores based on the root mean squared errors or other performance metrics); ranking the features based on the performance metrics or transformed values thereof; and identifying one or more features that each receive performance metrics lower than a predetermined threshold.

After the one or more features are identified, the automatic loop of training the dynamic model can continue by extracting 709 additional data from historical driving statistics, such as those logged by the data logging 707, for use in retraining the dynamic model. The above process can be repeated iteratively until the dynamic model performs satisfactorily according to a set of predetermined requirements.

The dynamic model is specifically trained for autonomously driving a particular ADV or a particular type or model of ADV. The dynamic model can be a neural network model, which may be represented by a linear regression, multilayer perception, or recurrent neural network model. The driving statistics collected from various vehicles can include various control commands (e.g., throttle, brake, steering commands) issued and responses or states of the vehicles (e.g., speeds, accelerations, decelerations, directions, angular velocity) at different points in time.

As shown in FIG. 7, in the online simulation and grading phase 720, the trained dynamic model can be put into a simulator, where a simulation with control-in-the-loop process 719 can be implemented. The performance of the dynamic model may be further evaluated to assess the accuracy of the dynamic model in predicting the behavior of the ADV for other controlled testing scenarios. In one aspect, the performance of the dynamic model may be evaluated based on the degree of similarity between the trajectories generated by the dynamic model and the ground truths from the controlled testing scenarios. Note that vehicle data generation phase 706, offline model training phase 710, and simulation phase 720 may be performed in different computing nodes, such as, for example, different cloud servers. Alternatively, they can be performed by different nodes of a cluster (e.g., application servers or backend servers behind a Web server).

Figure 8:
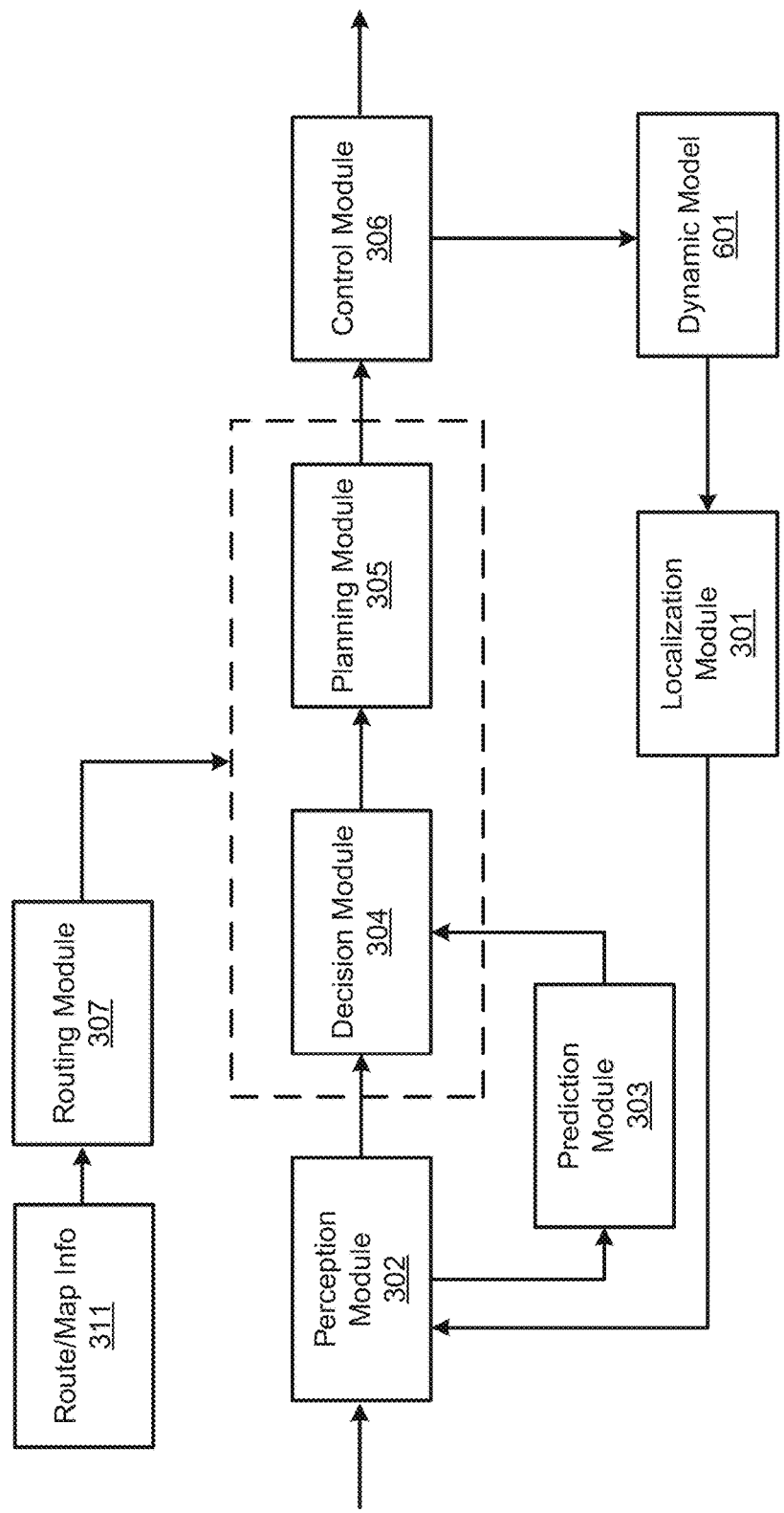
FIG. 8 is a block diagram illustrating an example of a control-in-the-loop simulation integrated with the perception and planning system and the control module of an autonomous vehicle to simulate the dynamic behavior of the vehicle according to one embodiment.

FIG. 8 is a block diagram illustrating an example of a control-in-the-loop simulation 800 integrated with the perception and planning system and the control module of an autonomous vehicle to simulate the dynamic behavior of the vehicle according to one embodiment. As discussed in FIGS. 3A-3B, the perception and planning system includes the modules to plan an optimal route and to generate planning and control data to guide a vehicle according to the planned route to reach the specified destination.

As shown, at each driving cycle, a loop is formed by the perception module 302, prediction module 303, decision module 304, planning module 305, control module 306, and localization module 301. Based on the planning and control data of the current driving cycle received from the planning module 305, the control module 306 generates one or more control commands (e.g., throttle, brake, steering control commands) for the next driving cycle. The dynamic model 601 updates the state and the pose of the simulated vehicle based on the control commands and the current vehicle state (e.g., speeds, accelerations, decelerations, directions, angular velocity). The output from the dynamic model 601 may be used by the localization module 301 to update the position of the vehicle and utilized by the control-in-the-loop simulation 800 for the next driving cycle.

When the dynamic model 601 is accurate, the simulated behavior of the vehicle should be the same as the actual behavior of the vehicle when fed with the same control commands. However, due to the limitation of the dynamic model 601 and the complex dynamics and physical constraints of the actuators (e.g., throttle, steering, and brake) of the vehicle when fed with the control commands, the simulated behavior from the dynamic model 601 will deviate from the actual behavior of the vehicle. Performance metrics may be used to evaluate the accuracy of the dynamic model 601 in predicting the actual behavior of the vehicle.

Figure 9:
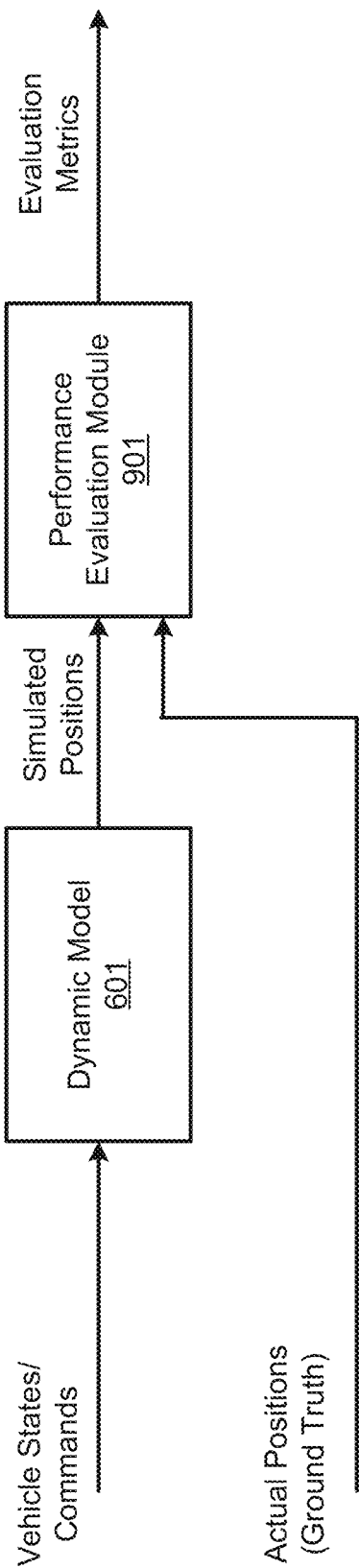
FIG. 9 illustrates an example operation to evaluate the performance of a dynamic model according to one embodiment.

FIG. 9 illustrates an example operation to evaluate the performance of a dynamic model 601 according to one embodiment. The dynamic model 601 may receive control commands and the state of the vehicle whose behavior is to be simulated.

In one aspect, the control commands and state information may be provided from driving statistics logged from a number of controlled testing scenarios, such as the driving statistics 603 of FIG. 6. The data generated from the controlled testing scenarios may be data generated by the vehicle under a variety of driving scenarios or driving conditions, which are specifically created for the purpose of generating testing data for evaluating the performance of the dynamic model. The driving statics may be data logged when the vehicle was manually driven or autonomously driven. The driving scenarios may include common driving maneuvers such as left/right turns, stop/non-stop, zig-zag trajectories, etc., and their combinations. The driving scenarios may also include relative long (e.g., 10 minutes) driving scenarios on normal urban roads with start/stops at traffic lights, left turns, right turns, lane changes and different speed variations, etc.

In one aspect, the control command may include throttle, brake, steering commands such as the amount of the throttle opening, braking force, and steering angle as a percentage of the maximum possible level. In the aspect, the state information of the vehicle may include the speed, acceleration, directions, angular velocity, etc., of the vehicle. To remove feedback control effects when evaluating the performance of the dynamic model 601, the loop of control-in-the-loop simulation shown in FIG. 8 may be opened to inject the control commands of the driving scenarios into the dynamic model 601.

A performance evaluation module 901 may compare the simulated positions generated by the dynamic model 601 over the duration of the driving scenarios with the actual positions (e.g., ground truths) of the vehicle applied with the same control commands from the driving scenarios. The performance evaluation module 901 may generate evaluation metrics to indicate the degree of similarity between the predicted trajectory from the dynamic model 601 and the actual trajectory represented by the ground truths.

In one aspect, the evaluation metrics may include cumulative absolute trajectory error (c-ATE) or mean absolute trajectory error (m-ATE). The c-ATE and m-ATE may be represented as:

$$\varepsilon_{c\text{-}ATE} = \sum_{i=1}^{N} \|p_{m,i} p_{gt,i}\|_2 \quad \text{(Equation 1)}$$

$$\varepsilon_{m\text{-}ATE} = \frac{1}{N} \sum_{i=1}^{N} \|p_{m,i} p_{gt,i}\|_2$$

where $p_{gt,i}$ is the ith point of ground truth trajectory, $p_{m,i}$ is the ith point of the predicted trajectory from the dynamic module 601, and N is the number of points in the trajectories. The $\|\cdot\|_2$ is used to measure the Euclidean distance between the points of the ground truth trajectory and the predicted trajectory.

In one aspect, the evaluation metrics may include the end-point difference (ED), which measures the distance between the end location of the ground truth trajectory and the predicted trajectory.

In one aspect, the evaluation metrics may include the two-sigma defect rate ($\varepsilon_{2\sigma}$), which represents the ratio of the number of points with true location error (e.g., Euclidean distance between the ground truth point and the dynamic-model predicted point as in Equation 1) falling out of the $2\sigma$ range of the predicted location error over the total number of points in the trajectory:

$$\varepsilon_{2\sigma} = 1 - \frac{\sum_{i=1}^{N} \eta(p_{m,i})}{N} \quad \text{(Equation 2)}$$

where $\eta(p_{m,i})=1$ when $p_{gt,i} \subset p_{m,i}+2\sigma$ and $\eta(p_{m,i})=0$ everywhere else.

In one aspect, the evaluation metrics may include the Hausdirff Distance (HAU) between the predicted trajectory and the ground truth trajectory represented as:

$$\varepsilon_{HAU} = \max \quad \text{(Equation 3)}$$

$$\left\{ \max_{\forall p_m \in T_{gt}} \min_{\forall p_m \in T_m} \|p_{gt}, p_m\|_2, \max_{\forall p_m \in T_m} \min_{\forall p_m \in T_{gt}} \|p_{gt}, p_m\| \right\}_2$$

where $p_m$ are the trajectory points from the dynamic-model predictor trajectory $T_m$ and $p_{gt}$ are the trajectory points from the ground truth trajectory $T_{gt}$. The max and the min functions operating on the trajectory points of $T_m$ and $T_{gt}$ compute the maximum and the minimum values of the trajectories. The Hausdirff Distance thus computes the greater of the Euclidean distance between the maximum point value of the $T_{gt}$ and the minimum points value of the $T_m$ or the Euclidean distance between the maximum point value of the $T_{in}$ and the minimum points value of the $T_{gt}$.

In one aspect, the evaluation metrics may include the longest common sub-sequence (LCSS) error between the predicted trajectory and the ground truth trajectory represented as:

$$\varepsilon_{LCSS} = 1 - \frac{L(T_m - T_{gt})}{\min(N_m, N_{gt})} \quad \text{(Equation 4)}$$

where $L(\cdot)$ is a function providing the longest common distance of the predicted trajectory and the ground truth trajectory when the distance between the $p_m$ and the $p_{gt}$ do not exceed a threshold in the x and the y direction. In one aspect, the threshold in the x and y directions may be set to 0.1 m. $N_m$ and the $N_{gt}$ are the length of the predicted trajectory and the ground truth trajectory, respectively.

In one aspect, the evaluation metrics may include dynamic time warping (DTW) to measure the similarity between the predicted trajectory and the ground truth trajectory. DTW allows the two trajectories to be warped or aligned in time so that the points from one trajectory may be mapped to the points from the other trajectory when the two trajectories have different length. DTW may be computed as the sum of the Euclidean distance between the matched pairs of trajectory points, similar to c-ATE and m-ATE.

The evaluation metrics generated by the performance evaluation module 901 are a measure of the accuracy of the predicted trajectory of the dynamic model 601 in predicting the ground truth trajectory of the vehicle, thus enabling the performance of the dynamic model 601 to be evaluated. The dynamic model 601 may then be fine-tuned by developing algorithms to minimize the residual error between the predicted trajectory and the ground truth trajectory or through re-training using different driving scenarios. In one aspect, the evaluation metrics may be used to select the most accurate one from a set of dynamic models being evaluated. The control-in-the-loop simulator may then use the fine-tuned or selected dynamic model in a closed loop to more accurately predict the behavior of the vehicle in real-world driving scenarios. While the evaluation metrics as described measure the similarity between the predicted trajectory and the ground truth trajectory, other evaluation metrics may measure the similarity between other dynamic states from the dynamic model and ground truth values such as heading angles, angular velocities, speed, acceleration, etc.

Figure 10:
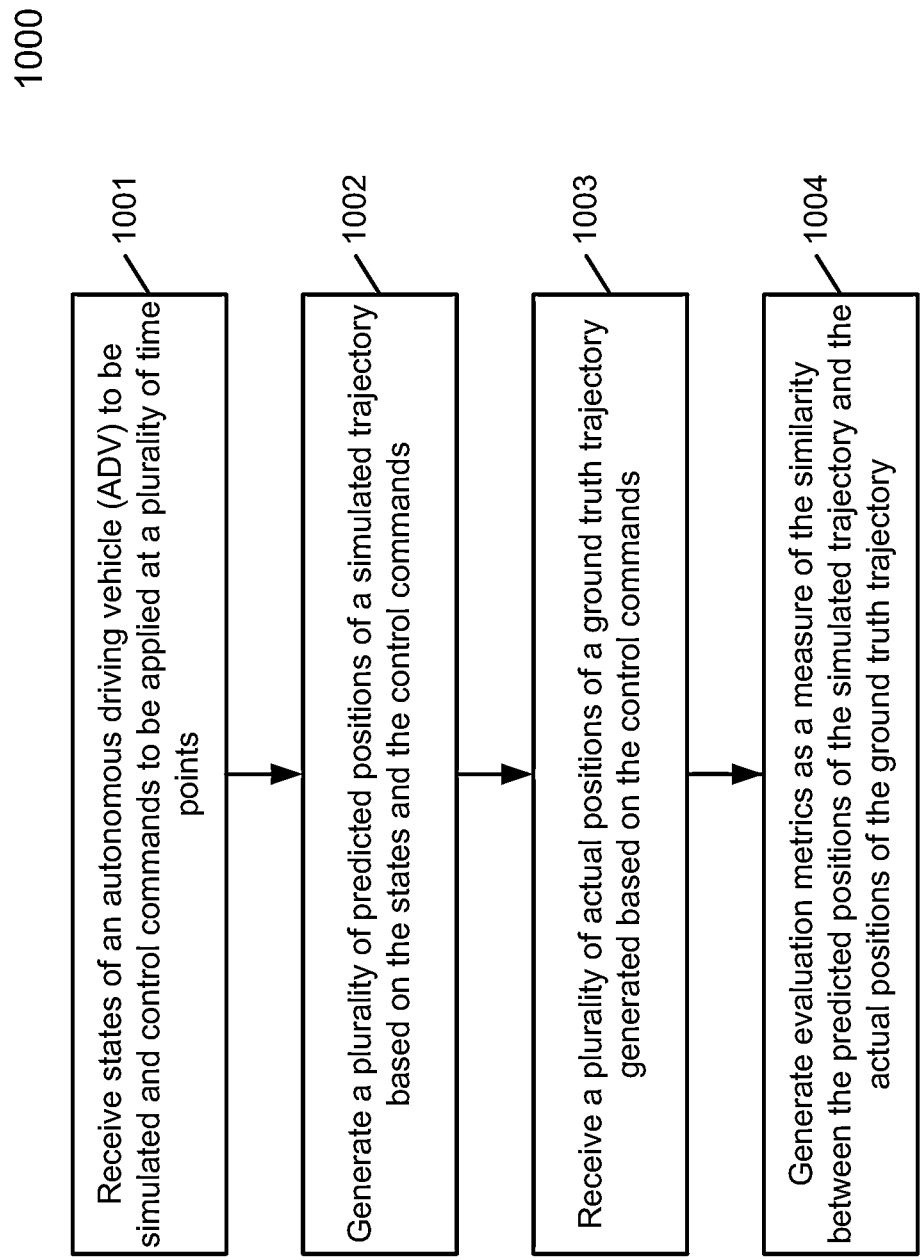
FIG. 10 is a flow diagram illustrating an example of a process for evaluating the performance of a dynamic model according to one embodiment.

FIG. 10 is a flow diagram illustrating an example of a process 1000 for evaluating the performance of a dynamic model according to one embodiment. Process 1000 may be performed by processing logic which may include software, hardware, or a combination thereof. For example, process 1000 may be performed as a part of dynamic model 500 in FIG. 5, dynamic model 601 or dynamic model evaluation module 605 in FIG. 6, control-in-the-loop simulation of FIG. 7 or 8, or dynamic model 601 or performance evaluation module 901 of FIG. 9.

At operation 1001, the process 1000 receives states of an ADV to be simulated and control commands to be applied to the ADV at a plurality of time points. The states and control commands may be driving statistics recorded from a driving scenario input to a dynamic model to simulate the behavior of the ADV.

At operation 1002, the process 1000 generates a plurality of predicted positions of a simulated trajectory based on the received states and the control commands from the dynamic model.

At operation 1003, the process 1000 receives a plurality of actual positions of a ground truth trajectory generated based on the same control commands applied to the ADV.

At operation 1004, the process 1000 generates evaluation metrics to measure the similarity between the predicted positions of the simulated trajectory and the actual positions of the ground truth trajectory.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilising terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the disclosure also relate to an apparatus for performing the operations herein. Such a computer program is stored in a non-transitory computer readable medium. A machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments of the present disclosure are not described with reference to any particular programming language. It will be appreciated that a variety of programming languages may be used to implement the teachings of embodiments of the disclosure as described herein.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

What is claimed is:

1. A computer-implemented method for evaluating performance of a dynamic simulator used to simulate behavior of an autonomous driving vehicle (ADV), the method comprising:
   receiving by the dynamic simulator a plurality of states of the ADV for a plurality of time points and a plurality of control commands to be applied to the ADV at the plurality of time points;
   generating by the dynamic simulator a plurality of predicted positions of a simulated trajectory for the ADV based on the plurality of states and the plurality of control commands;
   receiving a plurality of actual positions of a ground truth trajectory for the ADV, the plurality of actual positions being generated by applying the plurality of control commands to the ADV at the plurality of time points; and
   generating evaluation metrics to measure a similarity between the plurality of predicted positions of the simulated trajectory and the plurality of actual positions of the ground truth trajectory at the plurality of time points, wherein generating the evaluation metrics comprises generating a two-sigma defect rate representing a ratio of a number of the time points having a location error between one of the plurality of predicted positions and a corresponding one of the plurality of actual positions falling outside of a two-sigma range of a predicted position error over the plurality of time points in the simulated trajectory and the ground truth trajectory.

2. The method of claim 1, wherein each of the states of the ADV comprises a speed, an acceleration, and an angular velocity of the ADV at a corresponding one of the plurality of time points.

3. The method of claim 1, wherein each of the control commands comprises a throttle command, a brake command, and a steering command at a corresponding one of the plurality of time points.

4. The method of claim 1, wherein generating by the dynamic simulator the plurality of simulated positions of the simulated trajectory comprises:
   applying the control command for a current time point to the state of the ADV at the current time point to successively generate the predicted position of a next time point of the simulated trajectory.

5. The method of claim 1, wherein the dynamic simulator comprises a neural network model.

6. The method of claim 5, wherein the neural network model is trained with one or more features extracted from historical driving data, over one or more training iterations, until the neural network model satisfies predetermined requirements for each of a plurality of test scenarios.

7. The method of claim 6, wherein training the neural network model comprises identifying some of the one or more features that are associated with a score lower than a predetermined threshold, and extracting additional features from the historical driving data to train the neural network model in a subsequent training iteration.

8. The method of claim 7, wherein the evaluation metrics is generated for each of the one or more training iterations.

9. A non-transitory machine-readable medium having instructions stored therein, which when executed by a processor, cause the processor to perform operations, the operations comprising:
   receiving a plurality of states of an autonomous driving vehicle (ADV) for a plurality of time points and a plurality of control commands to be applied to the ADV at the plurality of time points;
   generating a plurality of predicted positions of a simulated trajectory for the ADV based on the plurality of states and the plurality of control commands;
   receiving a plurality of actual positions of a ground truth trajectory for the ADV, the plurality of actual positions being generated by applying the plurality of control commands to the ADV at the plurality of time points; and
   generating evaluation metrics to measure a similarity between the plurality of predicted positions of the simulated trajectory and the plurality of actual positions of the ground truth trajectory at the plurality of time points, wherein generating the evaluation metrics comprises accumulating a Euclidean distance between the predicted position and the corresponding actual position over the plurality of time points in the simulated trajectory and the ground truth trajectory.

10. The non-transitory machine-readable medium of claim 9, wherein each of the states of the ADV comprises a speed, an acceleration, and an angular velocity of the ADV at a corresponding one of the plurality of time points.

11. The non-transitory machine-readable medium of claim 9, wherein each of the control commands comprises a throttle command, a brake command, and a steering command at a corresponding one of the plurality of time points.

12. The non-transitory machine-readable medium of claim 9, wherein generating the plurality of simulated positions of the simulated trajectory comprises:
   applying the control command for a current time point to the state of the ADV at the current time point to successively generate the predicted position of a next time point of the simulated trajectory.

13. The non-transitory machine-readable medium of claim 9, wherein the dynamic simulator comprises a neural network model.

14. The non-transitory machine-readable medium of claim 13, wherein the neural network model is trained with one or more features extracted from historical driving data, over one or more training iterations, until the neural network model satisfies predetermined requirements for each of a plurality of test scenarios.

15. The non-transitory machine-readable medium of claim 14, wherein training the neural network model comprises identifying some of the one or more features that are associated with a score lower than a predetermined threshold, and extracting additional features from the historical driving data to train the neural network model in a subsequent training iteration.

16. The non-transitory machine-readable medium of claim 15, the evaluation metrics is generated for each of the one or more training iterations.

17. A data processing system, comprising:
a processor; and
a memory coupled to the processor to store instructions, which when executed by the processor, cause the processor to perform operations, the operations including:
receiving a plurality of states of an autonomous driving vehicle (ADV) sensed by at least sensor for a plurality of time points and a plurality of control commands to be applied to the ADV at the plurality of time points;
generating a plurality of predicted positions of a simulated trajectory for the ADV based on the plurality of states and the plurality of control commands;
receiving a plurality of actual positions of a ground truth trajectory for the ADV, the plurality of actual positions being generated by applying the plurality of control commands to the ADV at the plurality of time points; and
generating evaluation metrics to measure a similarity between the plurality of predicted positions of the simulated trajectory and the plurality of actual positions of the ground truth trajectory at the plurality of time points, wherein generating the evaluation metrics comprises at least one of: measuring an Euclidean distance between the predicted position at an end time point of the simulated trajectory and the actual position at an end time point of the ground truth trajectory; or measuring a Hausdirff Distance between the plurality of predicted positions of the simulated trajectory and the plurality of actual positions of the ground truth trajectory.

18. The system of claim 17, wherein each of the states of the ADV comprises a speed, an acceleration, and an angular velocity of the ADV at a corresponding one of the plurality of time points.

19. The system of claim 17, wherein each of the control commands comprises a throttle command, a brake command, and a steering command at a corresponding one of the plurality of time points.

20. The system of claim 17, wherein generating the evaluation metrics further comprises at least one of:
measuring a longest common sub-sequence error between one of the plurality of predicted positions and a corresponding one of the plurality of actual positions over the plurality of time points in the simulated trajectory and the ground truth trajectory; or
accumulating an Euclidean distance between one of the plurality of predicted positions in the simulated trajectory and a corresponding one of the plurality of actual positions in the ground truth trajectory after performing dynamic time warping to align the plurality of time points in the simulated trajectory and the plurality of time points in the ground truth.

* * * * *